(12) United States Patent
Yao et al.

(10) Patent No.: US 7,892,710 B2
(45) Date of Patent: Feb. 22, 2011

(54) METHOD FOR MAKING THREE-DIMENSIONAL STRUCTURES ON A SUBSTRATE HAVING MICRON DIMENSIONS, AND AN ARTICLE OF MANUFACTURE THREE-DIMENSIONAL OBJECTS ON A SUBSTRATE WITH MICRON DIMENSIONS

(75) Inventors: Peng Yao, Newark, DE (US); Dennis W. Prather, Newark, DE (US)

(73) Assignee: University of Delaware, Newark, DE (US)

( * ) Notice: Subject to any disclaimer, the term of this patent is extended or adjusted under 35 U.S.C. 154(b) by 491 days.

(21) Appl. No.: 11/569,602

(22) PCT Filed: May 26, 2005

(86) PCT No.: PCT/US2005/018402

§ 371 (c)(1),
(2), (4) Date: Dec. 7, 2006

(87) PCT Pub. No.: WO2006/007192

PCT Pub. Date: Jan. 19, 2006

(65) Prior Publication Data

US 2008/0213524 A1 Sep. 4, 2008

Related U.S. Application Data

(60) Provisional application No. 60/575,074, filed on May 27, 2004.

(51) Int. Cl.
*G03C 1/00* (2006.01)
(52) U.S. Cl. .............................. 430/15; 430/9
(58) Field of Classification Search ..................... 430/9, 430/11, 12, 14, 15
See application file for complete search history.

(56) References Cited

U.S. PATENT DOCUMENTS

| 5,006,478 | A | 4/1991 | Kobayashi et al. |
| 5,408,742 | A | 4/1995 | Zaidel et al. |
| 5,712,078 | A * | 1/1998 | Huang et al. ............ 430/270.1 |
| 2005/0111781 | A1* | 5/2005 | Jain et al. .................... 385/15 |
| 2005/0191016 | A1* | 9/2005 | Ishikawa et al. ............ 385/115 |

* cited by examiner

*Primary Examiner*—Kathleen Duda
(74) *Attorney, Agent, or Firm*—RatnerPrestia

(57) ABSTRACT

A method and article of manufacture for three-dimensional structures having micron dimensions includes coating a substrate with layers of photo resist. Each layer of photo resist is exposed with its own two-dimensional mask defining one slice of an object. Subsequent layers of photo resist are exposed with different patterns. Once all layers have been fabricated and exposed to identify two-dimensional features for the layer, the multiple layers are developed to removed photo resist which has not been exposed. The layered structure represents a three-dimensional object where the depth dimension is defined by the photo resist layer thickness. By decreasing the wavelength of the light exposure, it is possible to confine exposure to a single layer of photo resist.

6 Claims, 6 Drawing Sheets

METHOD FOR MAKING THREE-DIMENSIONAL STRUCTURES ON A SUBSTRATE HAVING MICRON DIMENSIONS, AND AN ARTICLE OF MANUFACTURE THREE-DIMENSIONAL OBJECTS ON A SUBSTRATE WITH MICRON DIMENSIONS

CROSS-REFERENCE TO RELATED APPLICATIONS

This application is a National Stage Entry under 35 U.S.C. §371 of International Application PCT/US2005/018402 filed on May 26, 2005. International Application PCT/US2005/018402 claims priority to U.S. provisional application 60/575,074, filed May 27, 2004. The entire contents of each of these applications are incorporated herein by reference.

STATEMENT REGARDING FEDERALLY SPONSORED RESEARCH

This invention was made with Government support. The Government may have certain rights in the invention under contract number DAAD19-01-2-0001.

BACKGROUND

This disclosure relates to the manufacture of arbitrary three-dimensional structures on a substrate. Specifically, a method is disclosed for creating three-dimensional structures having dimensions in the micron level, as well as an article of manufacture made from the method which creates three dimensional objects having dimensions in the micron level.

Photolithography has been used for many years to create circuit details for electronic devices. Specifically, the techniques are used to deposit on a substrate layers of material which can be formed into three-dimensional circuit components. A photolithography provides the ability to create from a mask circuit features in the micron level which can be created on the substrate through a combination of deposition, exposure to light through a mask and developing images formed on the substrate. The resulting structures are electrical components which function as transistors and resistor elements which are interconnected in accordance with the mask used to create the layout.

In the field of photonic crystals, there is a need to create small optical (photonic) circuit elements on a substrate having periodic structures with dimensions at the micron level. Also, micro-fluidic devices have been developed which have components with micro-channels also having dimensions in the micron range. Each of these technologies could benefit from a method of manufacture of precision three-dimensional components on a substrate.

SUMMARY

This disclosure provides a method, and article of manufacture made by the method, for making three-dimensional structures having micron dimensions. A substrate is coated with a first layer of photo resist. The first layer of photo resist is exposed through a mask to form two-dimensions of a structure on the exposed photo resist. Subsequent layers of photo resist are formed over the exposed first layer, and are in turn exposed through a mask to form additional two-dimensional outlines on each subsequent layer of photo resist. When a plurality of layers of photo resist having two-dimensional outlines are formed on the substrate, the structure is developed. Each exposed outline of a resist layer defines the shape of a three-dimensional object form when all the layers have been developed. The third dimension of the structure is a function of a layer thickness, which is removed for all unexposed areas of each layer.

In accordance with one embodiment, the photo resist is either spun or sprayed in layers on the substrate surface. Each layer is heat treated by a soft bake before it is exposed by the mask. Following exposure of a mask, the substrate and patterned layer are again heated to form the latent image defining two-dimensions of the object. Once all layers are formed with the two-dimensional information, the resist is developed and unexposed areas are removed.

The result of the method is an article of manufacture which has a plurality of layers of photo resist forming objects. The objects are defined in two-dimensions by the light exposed areas of each layer, and in the third dimension by the thickness of the photo resist. Areas which were not light exposed are removed leaving only objects which comprise the exposed areas of each photo resist layer.

DETAILED DESCRIPTION

Figure 1:
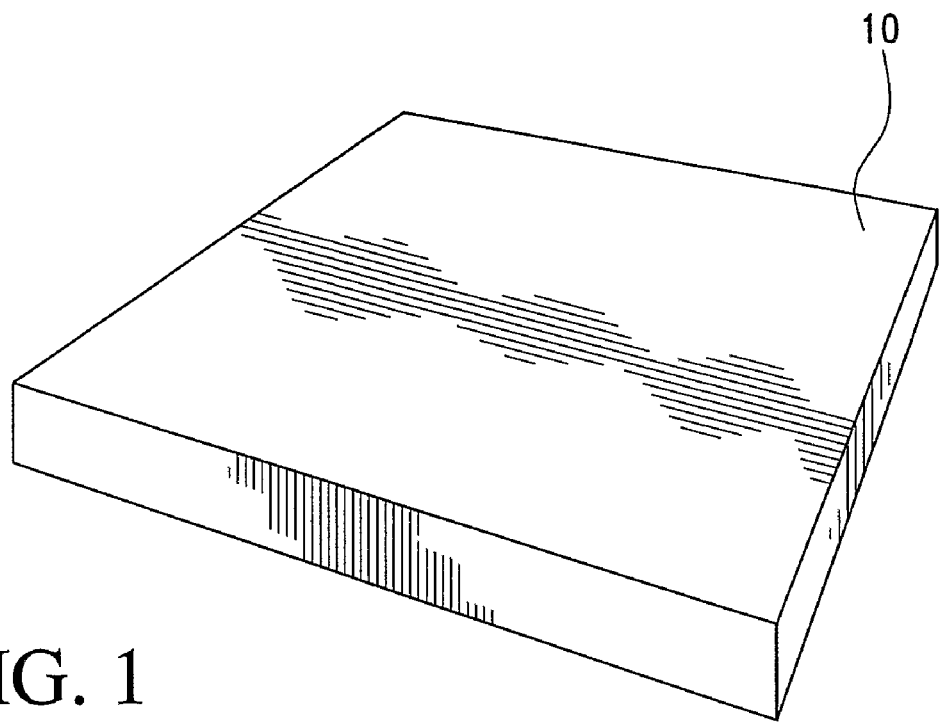
FIG. 1 shows a substrate 10 on which three-dimensional structures having micron dimensions are formed.

FIGS. 1-13 illustrate a process for making arbitrarily shaped 3D structures having dimensions in microns. FIG. 1 shows a substrate 10 which can support a number of layers of photo resist. The photo resist is exposed and developed to produce objects supported on the substrate 10.

3D objects can be fabricated in accordance with this disclosure from a series of layers, where each layer assumes the configuration of a 2D pattern or slice of the desired three-dimensional object. Initially, if the 3D structure is computer generated using mesh graphical techniques, the object can be reduced to a series of two-dimensional patterns or slices. In accordance with the disclosure, each of the slices is reproduced on the substrate as a layer of photo resist, having a two-dimensional pattern which corresponds to a configuration of a slice of the object.

Figure 2:
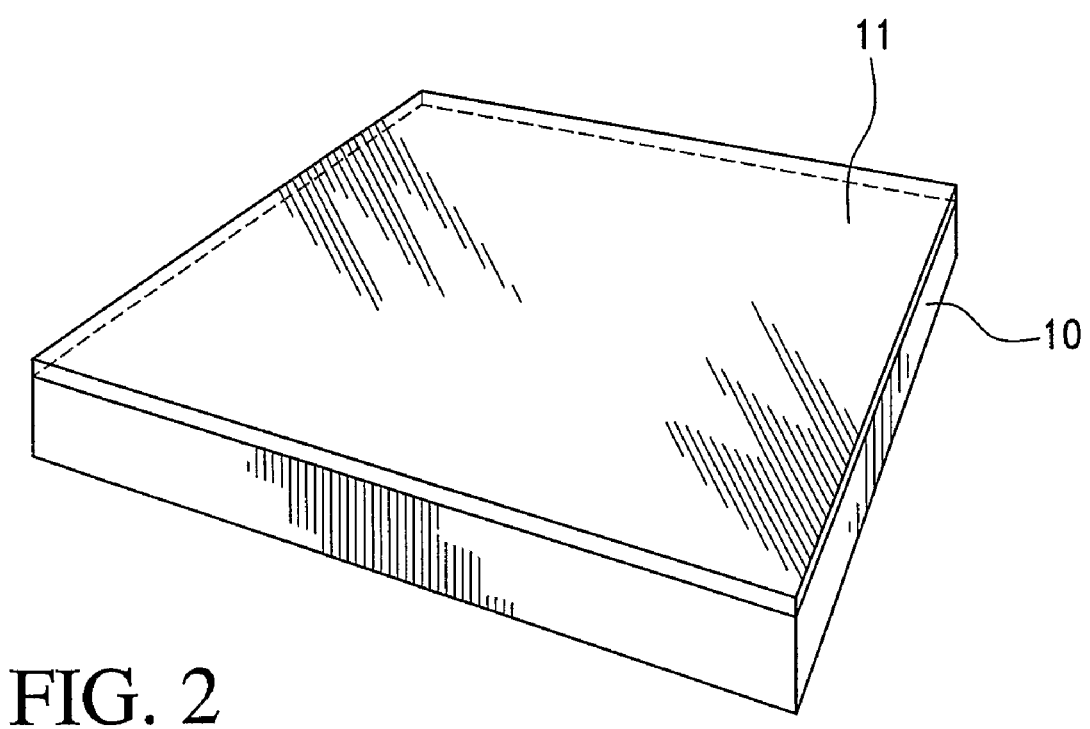
FIG. 2 illustrates a first layer of photo resist 11 spin coated on the surface of substrate 10.
Figure 3:
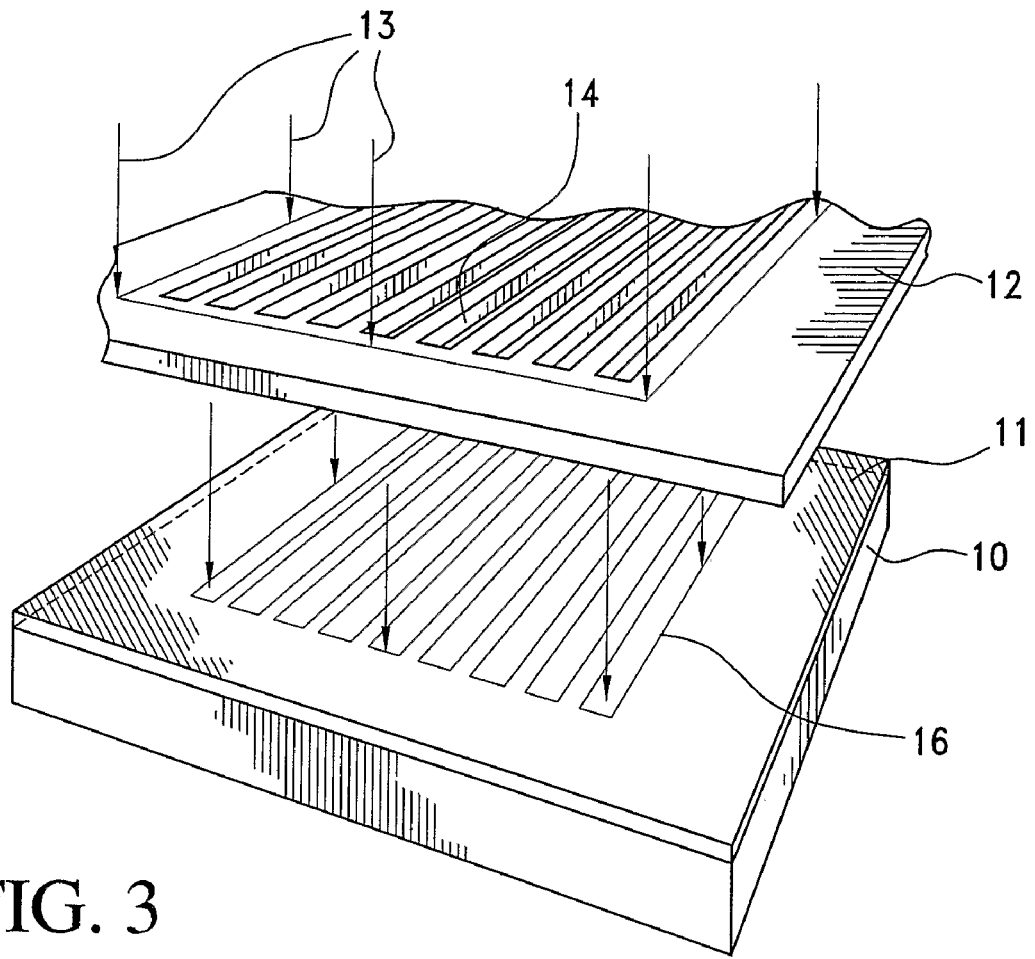
FIG. 3 illustrates the formation of a first set of structures in the photo resist 11.

The layers of the object are created in accordance with the process of FIGS. 1-13. Each layer representing a slice of the object is made from a layer of photo resist. FIG. 2 shows the first layer of photo resist 11 which has been spin coated on a substrate 10 to a thickness from sub-micron to several microns. The layer 11, after being deposited on the substrate 10, is soft baked with a hot plate to a temperature of approximately 130° C. The spin coated photo resist layer 11 is exposed through a mask 12 to light 13 as shown in FIG. 3. Openings 14 in the mask result in the photo resist 11 having exposed areas defined by the mask openings 14. As is known in the art, the photo mask will include a proper alignment marks so that when additional surface layers are patterned, the layers are in registry.

The photo resist is selected so that the wavelength of the exposing light 13 is shorter than the wavelength of light with which the resist is designed. For instance, a light source of 254 nm wavelength may be used to expose an i-line resist which is designed for exposure to a wavelength of 365 nm. By mismatching the exposing light and photo resist characteristics, it is possible to confine the exposure to a single layer of photo resist. Exposed areas of the photo resist are subject to cross linking increasing the molecular weight of the exposed resist. Once the material has been subject to cross linking, the exposed areas have no solubility to solvent which is used to remove the resist in unexposed areas. The result is that each layer may have a pattern etched in the photo resist which does not effect the patterns in other layers. Other resist coating methods, or additional coating steps such as spray coating, dry film resist, chemical surface treatment, electron photoretic deposition, etc. may be employed.

Figure 4:
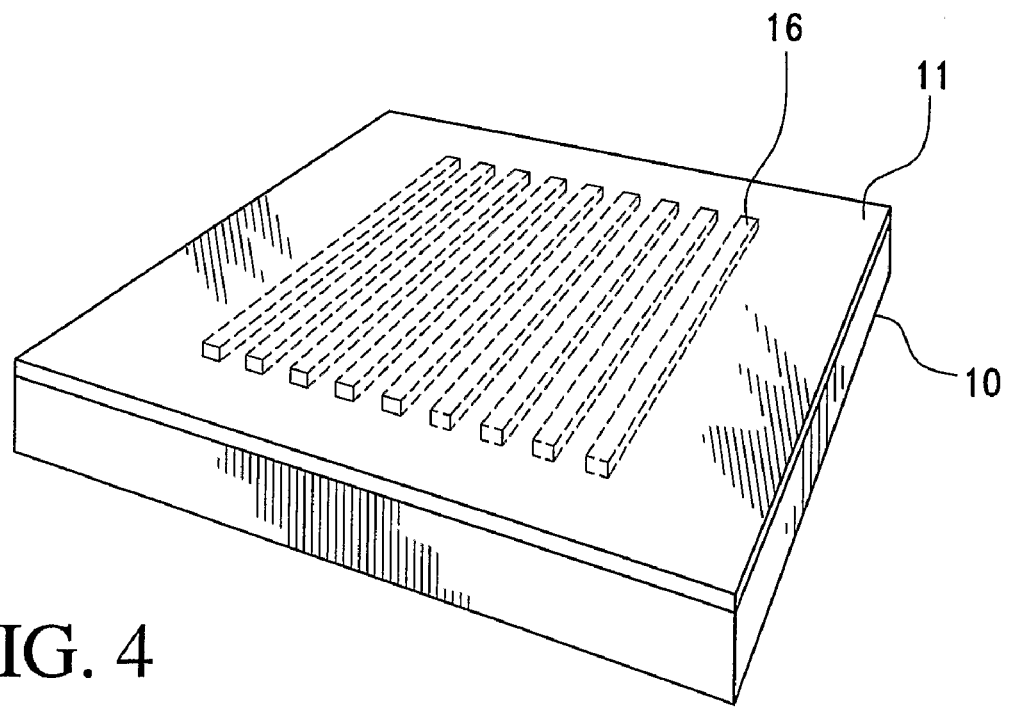
FIG. 4 shows the latent images of structures which were formed in the step of FIG. 3.

Once the first layer 11 has been deposited and exposed through a mask 12, as shown in FIG. 3, the 2D pattern 16 is formed in the photo resist layer 11 as shown in FIG. 4. For layer 11, a plurality of rectangular elements, which are parallel as defined by the mask 12, are created in the layer 11.

The method in accordance with an embodiment may utilize a second bake step, wherein the layer is baked to a temperature of approximately 120° C. (the post exposure bake temperature, as well as the soft bake temperature, depends on particular resist. For example, if another commonly used photoresist SU8 is used, the two bake steps use same temperature condition (60° C. for 1 minute and 90° C. for 1 minute)) following the exposure of the photo resist 11 with a mask 12, which will form the latent image in the event that the image has not been formed immediately after the exposure of the photo resist 11.

Figure 5:
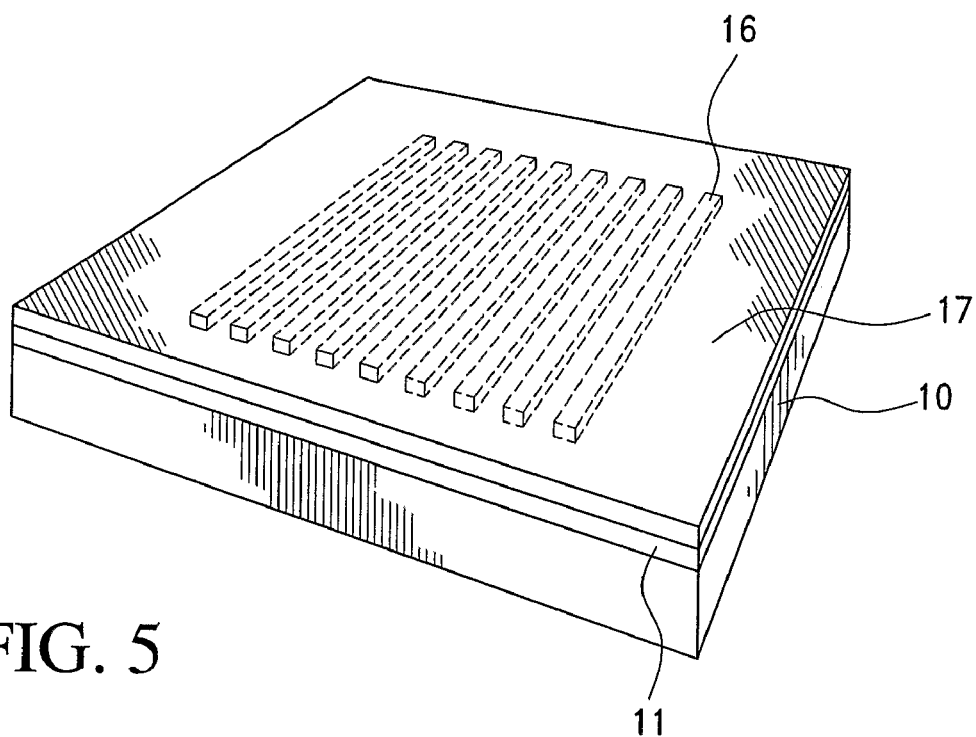
FIG. 5 illustrates a second photo resist layer 17 over the latent images 16 formed in photo resist layer 11.
Figure 6:
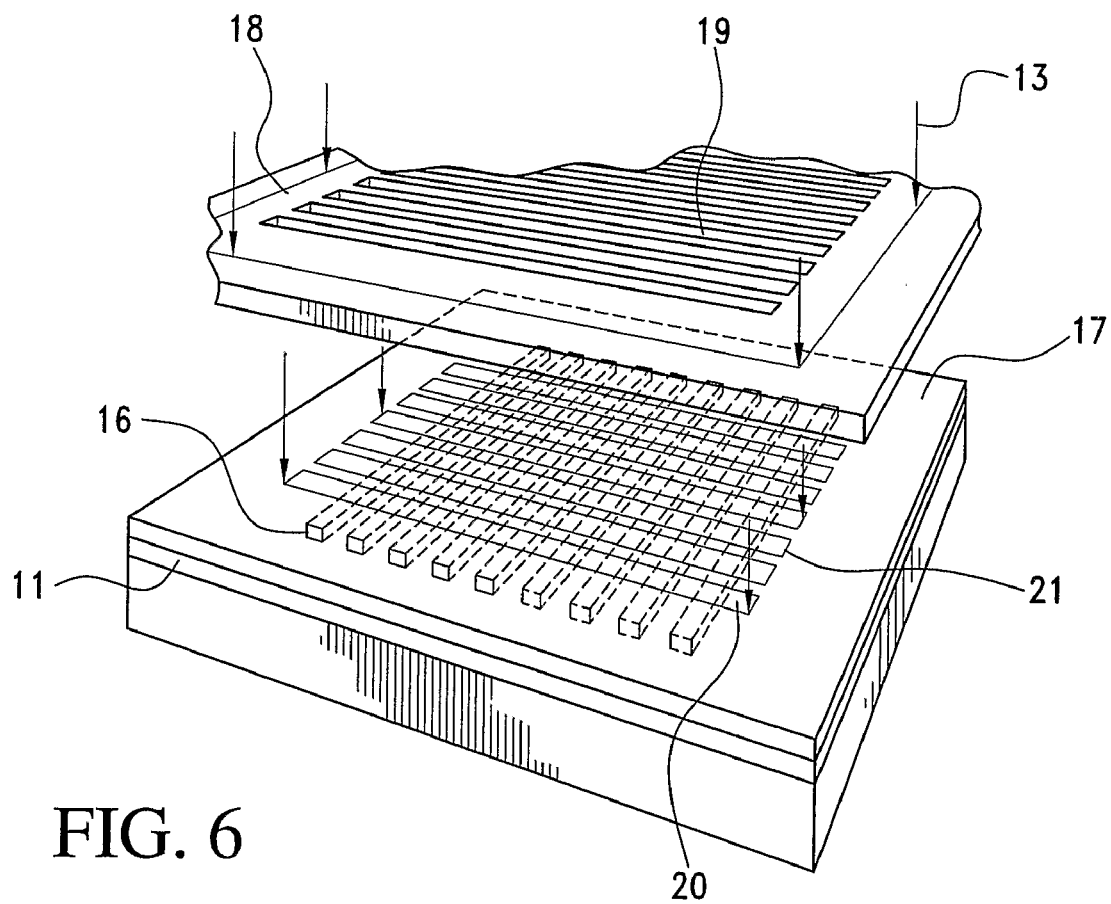
FIG. 6 shows the formation of additional structures in the photo resist 17.
Figure 7:
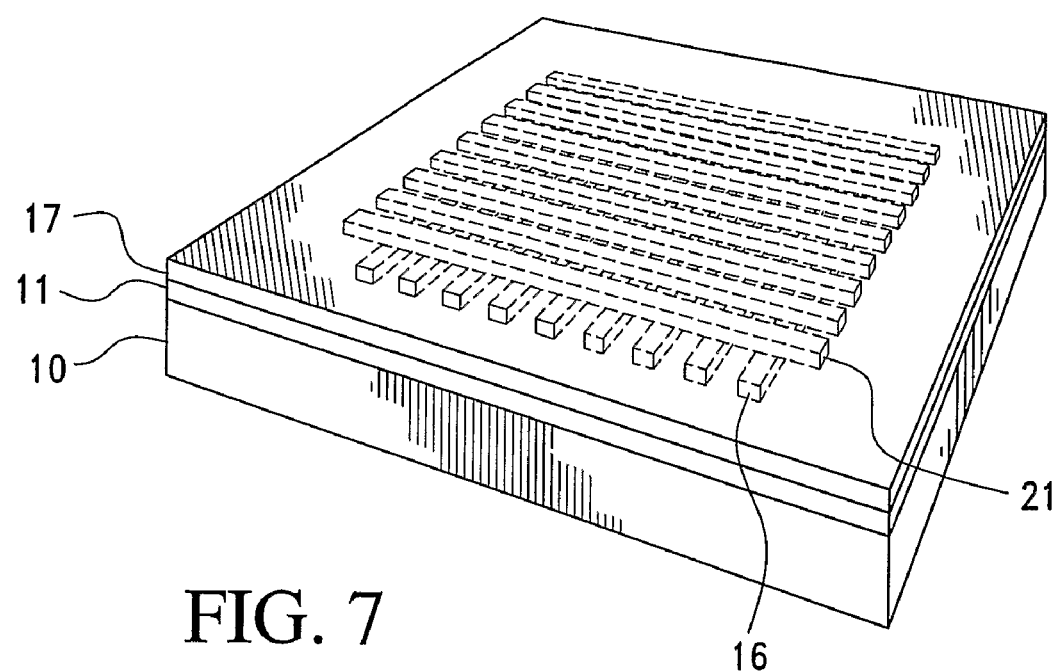
FIG. 7 shows the image of structures formed within the photo resist layer 17 and 11.
Figure 8:
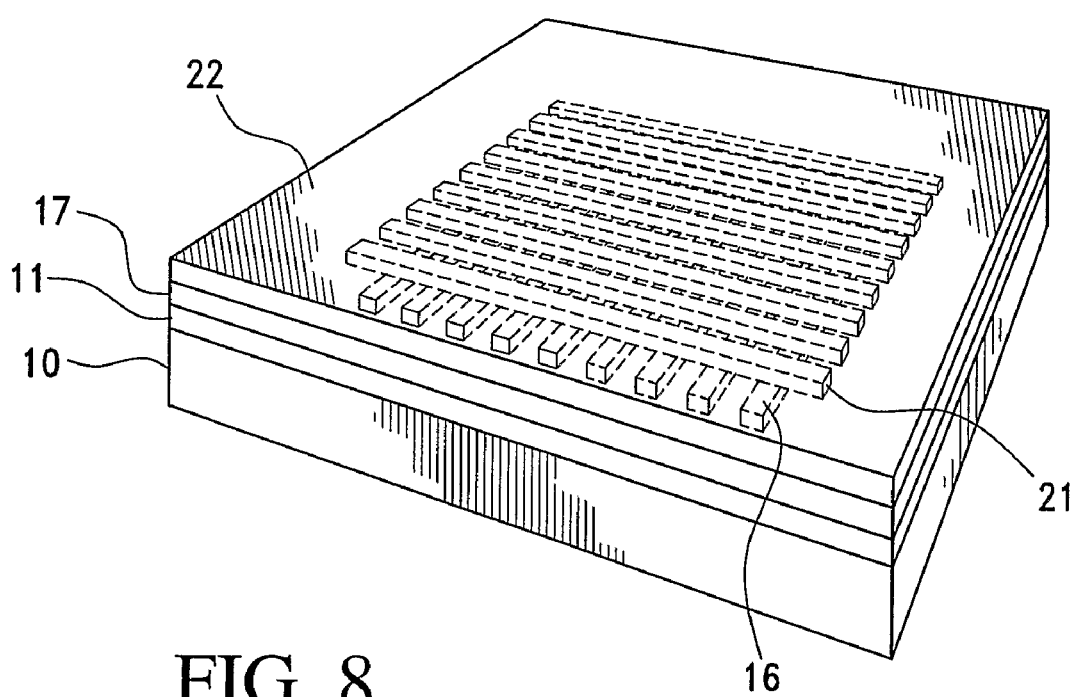
FIG. 8 shows the formation of another layer of photo resist 22 over the layer of photo resist 17.

FIGS. 5-7 demonstrate how additional layers of photo resist 17 may be formed over layer 11, and additional two-dimensional features may be formed in the new layer of photo resist 17. A second mask 18 includes a plurality of parallel features 19 which are perpendicular to the features 16 of photo resist layer 11. The process is the same, wherein the photo resist 17 is soft baked after being spin coated on surface 11. As shown in FIG. 7, after being exposed by light 13 through mask 18, a plurality of rectangular bars 21 are formed in the photo resist 17.

Exposed areas of the photo resist layers comprise cross-linked molecules due to the exposure which are not soluble by solvents conventionally used to removed photo resist. Accordingly, during the step of developing the layers of photo resist, to be described with respect to FIGS. 11-13, unexposed areas of resist will be removed leaving only the exposed features in each of the layers.

Figure 9:
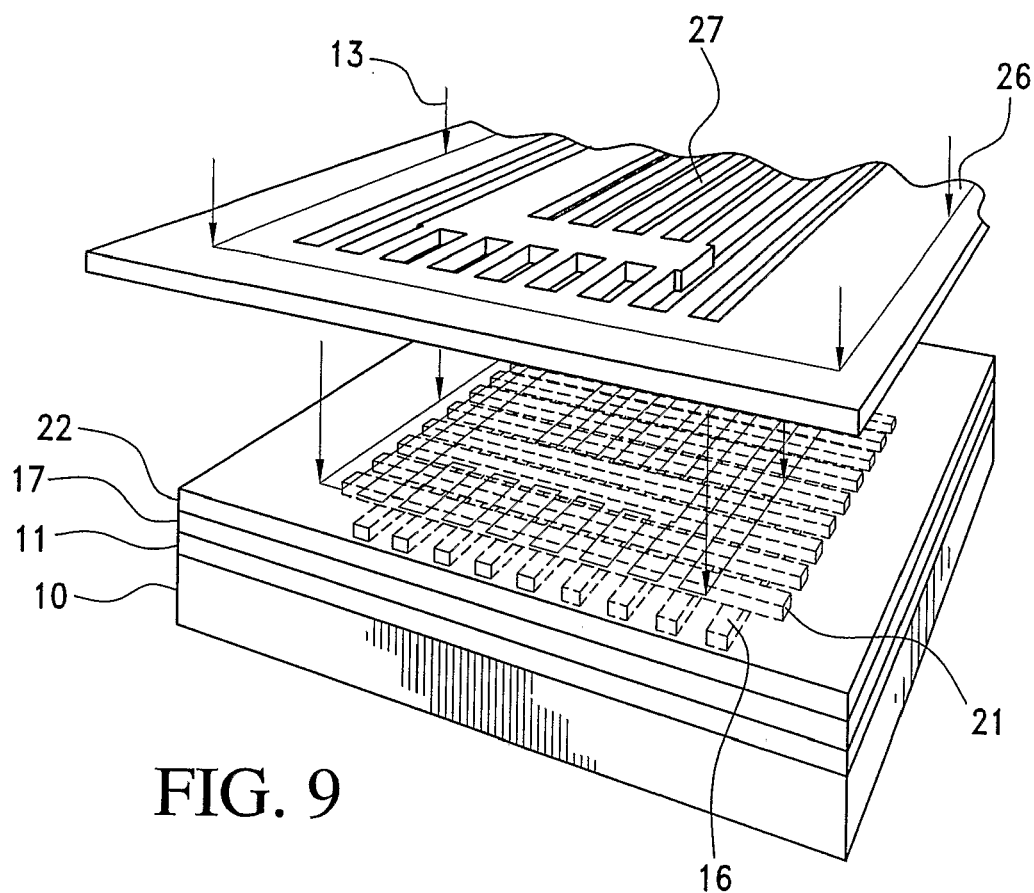
FIG. 9 shows the step for forming images in the layer of photo resist 22.

FIG. 9 shows a subsequent layer of photo resist 22 deposited on layer 17. In a similar matter, layer 22 is soft baked and exposed through a mask 26 having plurality of light emitting apertures 27. The light 13 is of the aforementioned wavelength, which is selected to expose the underlying photo resist without exposing the previously configured layers of photo resist 11 and 17.

Figure 10:
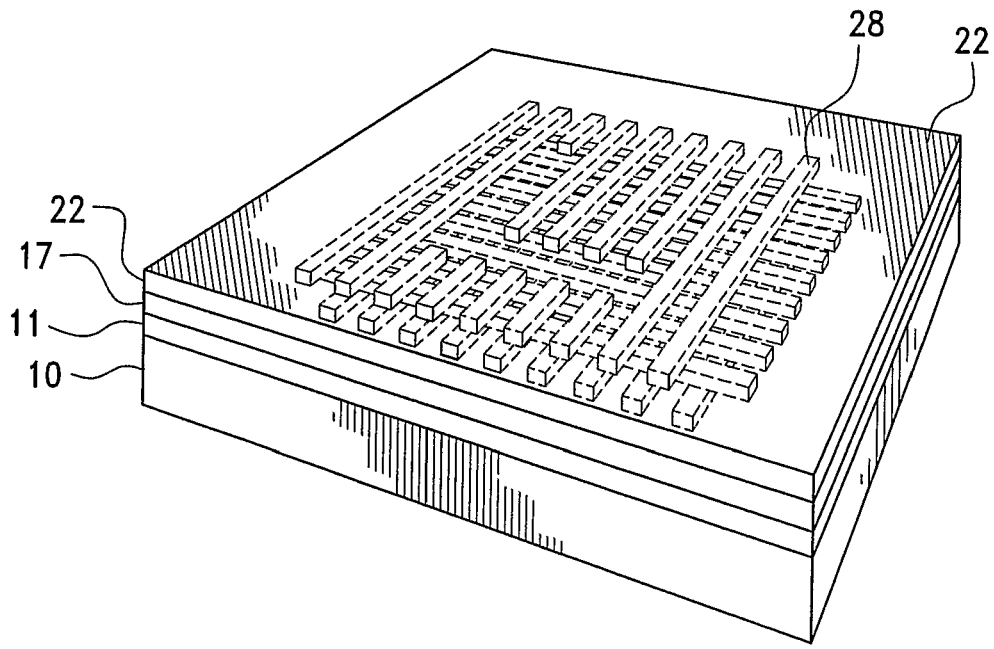
FIG. 10 shows the exposed portions for the layers of photo resist 11, 17 and 22.
Figure 11:
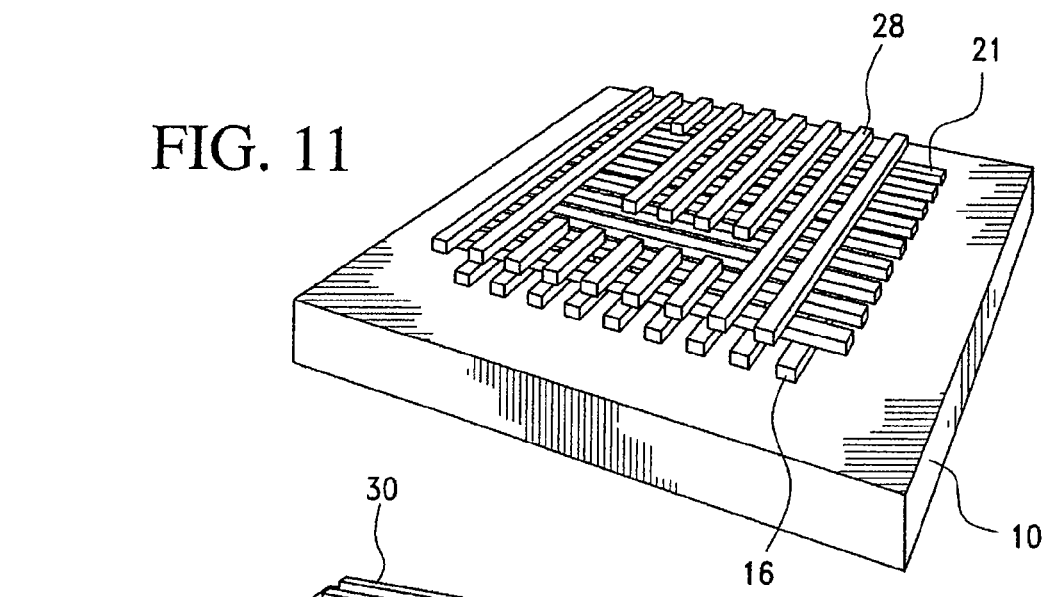
FIG. 11 shows the substrate 10 after developing.

As shown in FIG. 10, new structures 28 defined by the two-dimensional mask 26 are formed in the layer 22.

When all of the layers for comprising the 3D structure have been deposited and exposed by the two-dimensional masks, latent images are formed throughout the layers as shown in FIG. 10. The entire substrate and composite layers of photo resist are then developed, to derive the structure shown in FIG. 11. Photo resist which has not been exposed, and therefore does not exhibit cross-linking of the molecules, is dissolved by the developer leaving only the photo resist of each layer which had been exposed to light.

Figure 12:
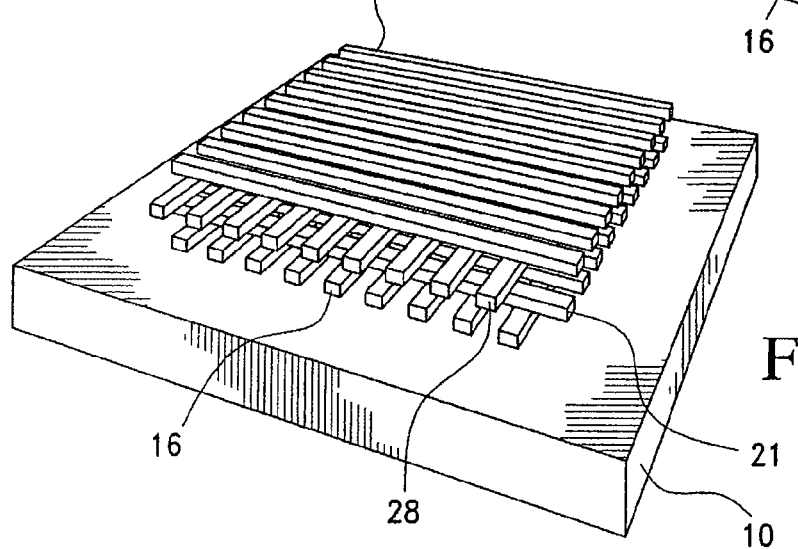
FIG. 12 shows another example where still another layer of 30 of photo resist is used to create additional objects on the substrate 10.
Figure 13:
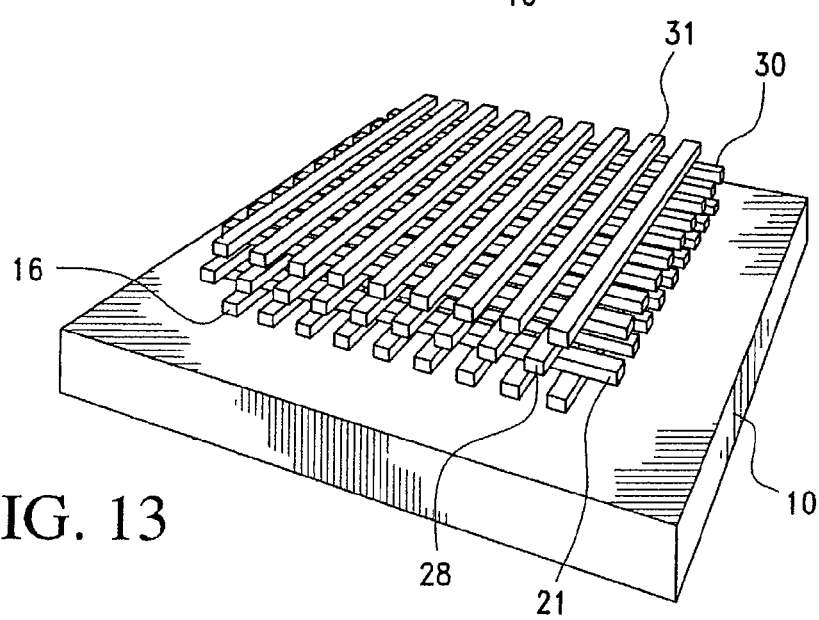
FIG. 13 shows still another layer of objects 31 formed on the previous layers of objects.

FIGS. 12 and 13 show three-dimensional objects formed with additional layers of photo resist to produce additional structures 30 and 31.

The foregoing process can be used to create objects on a substrate having dimensions in microns. This is specifically applicable, but not limited to, the creation of photonic optical circuit devices as well as micro-fluidic devices. Feature size may be limited by the diffusion of photo acid upon the post exposure baking if the cross-linking mechanism is chemically amplified. Using spin coating techniques, the thickness of each layer may be varied so that the objects third dimension may be more precisely controlled.

The total number of layers that can be fabricated depends on the difference of solubility between the cross-linked resist due to exposure, and the uncrossed linked resist which has not been exposed.

The foregoing description of the disclosure illustrates and describes various aspects of the inventive concept. Additionally, the disclosure shows and describes various embodiments of the disclosure in the context of a method for making three-dimensional structures on a substrate having micron dimensions, and an article of manufacture having three-dimensional objects on a substrate with micron dimensions, but, as mentioned above, it is to be understood that this disclosure is capable of use in various other combinations, modifications, and environments and is capable of changes or modifications within the scope of the inventive concept as expressed herein, commensurate with the above teachings and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

What we claim is:

1. An article of manufacture comprising:
a substrate; and
a three-dimensional (3D) structure on the substrate, the 3D structure including a first layer of exposed photo resist forming a first plurality of parallel features and a second layer of exposed photo resist forming a second plurality of parallel features perpendicular to the first plurality of parallel features, the second plurality of parallel features supported by the first plurality of parallel features.

2. The article of manufacture of claim 1, wherein said first and second layers of exposed photo resist are individually exposed.

3. The article of manufacture of claim 1, wherein said first and second plurality of parallel features form channels of a photonic device.

4. The article of manufacture of claim 1, wherein said first and second plurality of parallel features form micro-channels of a fluidic component.

5. The article of manufacture of claim 1, wherein said first and second layers of exposed photo resist have a high contrast resist which limits the number of said plurality of photo resist layers.

6. The article of manufacture of claim 1, wherein the first layer of exposed photo resist and the second layer of exposed photo resist are adjacent.

* * * * *

UNITED STATES PATENT AND TRADEMARK OFFICE
CERTIFICATE OF CORRECTION

| | | |
|---|---|---|
| PATENT NO. | : 7,892,710 B2 | Page 1 of 1 |
| APPLICATION NO. | : 11/569602 | |
| DATED | : February 22, 2011 | |
| INVENTOR(S) | : Peng Yao and Dennis W. Prather | |

It is certified that error appears in the above-identified patent and that said Letters Patent is hereby corrected as shown below:

On the Cover Page, field (54), and at column 1, lines 1-7, TITLE:

"METHOD FOR MAKING THREE-DIMENSIONAL STRUCTURES ON A SUBSTRATE HAVING MICRON DIMENSIONS, AND AN ARTICLE OF MANUFACTURE THREE-DIMENSIONAL OBJECTS ON A SUBSTRATE WITH MICRON DIMENSIONS" should read --METHOD FOR MAKING THREE-DIMENSIONAL STRUCTURES ON A SUBSTRATE HAVING MICRON DIMENSIONS, AND AN ARTICLE OF MANUFACTURE HAVING THREE-DIMENSIONAL OBJECTS ON A SUBSTRATE WITH MICRON DIMENSIONS--.

Signed and Sealed this
Twelfth Day of April, 2011

David J. Kappos
*Director of the United States Patent and Trademark Office*